United States Patent [19]

Worp et al.

[11] Patent Number: 5,136,366
[45] Date of Patent: Aug. 4, 1992

[54] OVERMOLDED SEMICONDUCTOR PACKAGE WITH ANCHORING MEANS

[75] Inventors: Nicolaas H. Worp, Margate; Bruce J. Freyman, Plantation; Kurt C. Conrath, Lauderhill, all of Fla.

[73] Assignee: Motorola, Inc., Schaumburg, Ill.

[21] Appl. No.: 609,355

[22] Filed: Nov. 5, 1990

[51] Int. Cl.$^5$ .................. H01L 39/02; H01L 23/28; H05K 7/02; H05K 1/16

[52] U.S. Cl. .................. 357/72; 357/74; 357/80; 361/400; 361/402

[58] Field of Search .................. 357/70, 72, 74, 80; 361/403, 405, 407, 399, 400, 402

[56] References Cited

U.S. PATENT DOCUMENTS

| | | | |
|---|---|---|---|
| 3,515,955 | 6/1970 | Butenschon | 357/72 |
| 3,823,350 | 7/1974 | Stoner | 357/72 |
| 3,909,838 | 9/1975 | Beyerlein | 357/72 |
| 4,822,550 | 4/1989 | Komathu . | |
| 4,841,100 | 6/1989 | Ignasiak | 361/400 |
| 4,935,581 | 6/1990 | Komathu . | |
| 5,032,953 | 7/1991 | Carl et al. | 361/405 |

Primary Examiner—Andrew J. James
Assistant Examiner—Carl Whitehead, Jr.
Attorney, Agent, or Firm—Dale W. Dorinski

[57] ABSTRACT

An overmolded semiconductor package (150) is formed by electrically and mechanically attaching a semiconductor device (100) to a substrate (110) having at least one hole (130). A plastic molding compound (140) is overmolded around the semiconductor device 100) so as to encapsulate the device, the molding compound (140) extending at least partially into the substrate hole (130) to form an anchor (135) to aid in bonding the molding compound to the substrate. An alternate embodiment of the invention forms a pedestal (449) from the portion of the molding compound extending beyond the surface of the substrate. The pedestal functions as an anchor to aid in bonding the molding compound (440) to the substrate, and also as a spacer to maintain a preselected clearance between the substrate (410) and the printed circuit board (460). The portion of the molding compound extending beyond the surface of the substrate may also be used to form an alignment pin (548). The pin functions as an anchor to aid in bonding the molding compound to the substrate, and also as an alignment aid to maintain positional relationships between the substrate and the printed circuit board. In another embodiment of the invention, the overmolded semiconductor is mounted directly on a printed circuit board containing other active circuitry.

15 Claims, 3 Drawing Sheets

OVERMOLDED SEMICONDUCTOR PACKAGE WITH ANCHORING MEANS

TECHNICAL FIELD

This invention relates generally to an electronic device, and more particularly to package for semiconductor devices, and most particularly to overmolded semiconductor devices.

BACKGROUND

Semiconductor devices are very small and delicate, and must be protected from physical and environmental damage. Traditionally, the devices have been enclosed in a metal can, encapsulated by covering or potting with an organic material, or encapsulated in plastic by casting or molding. The latter method, known as transfer molding or overmolding, places the semiconductor device, which has been electrically connected to a lead structure, lead frame, or circuit carrying substrate, in a mold cavity. A thermoset material is molded around the semiconductor device to form a solid monolithic unit that is sealed from environmental damage and is rugged enough to withstand physical damage while being assembled onto a circuit board. This technology may be used to form a package for an individual component, or may be used to encapsulate a semiconductor device that has been mounted directly on a circuit carrying substrate.

The molding resin is preformed into a mass of precisely calculated size and shape, and placed into a hydraulically operated transfer mold. A plunger forces the resin through the runners and gates, into the cavity portion of the mold. The molding resin is injected into the individual mold cavities under pressure to flow around the semiconductor devices and form the molded package. During injection and flow, the molding material begins to cure and continues curing for a predetermined time after flow has stopped. After the specified curing time, the mold is opened and the molded packages are taken out of the mold tool and separated from the runners and gates. The amount of molding material is critical, in that there must be adequate material to completely fill the mold cavity so that no voids are left in the molded semiconductor packages. Excess molding material forces the mold to open and creates flash around the edges of the molded packages, necessitating undesirable touch up operations.

Molding resins used for semiconductor encapsulation are classified as thermoplastic or thermoset, with thermoset being the predominant type of resin. Thermoplastics typically exhibit problems such as melting or blistering during soldering of the semiconductor package, and the high moisture uptake of these resins leads to loss of dielectric properties. Silicone, epoxy and silicone modified epoxy resins are the thermoset resins used for encapsulating semiconductor devices. However, silicones and silicone-epoxy resins have essentially been replaced because of the lower price and higher reliability of modern epoxy resins. Modern electronics applications require a high heat resistance and high moisture resistance that epoxy-novolac resins can offer. The introduction of low pressure transfer molding techniques has resulted in the broad use of novolac-modified epoxy resins.

When used to encapsulate a semiconductor device that has been mounted directly on a modified epoxy resin substrate, the epoxy-novolac resins suffer from poor adhesion to the substrate. Overmolded devices rely entirely upon adhesion of the molding compound in order to bond the overmold compound to the substrate, and are prone to adhesion failures at this interface. Minor amounts of contaminants in the molding compound or on the surface of the substrate can cause adhesion failure, as will flexing or other mechanical stress of the substrate. Adhesion failure can result in corrosion, or catastrophic failure of the device by damaging the delicate electrical connections or cracking of the semiconductor material. Clearly, an improved method of bonding the overmolded compound to the substrate is needed.

SUMMARY OF THE INVENTION

Briefly, according to the invention, an overmolded semiconductor package is formed by electrically and mechanically attaching a semiconductor device to a substrate having at least one hole. A plastic molding compound is overmolded around the semiconductor device so as to encapsulate the device, the molding compound extending into the substrate hole to form an anchor to aid in bonding the molding compound to the substrate.

In another embodiment of the invention, a portion of the molding compound extends beyond the surface of the substrate to form a pedestal. The pedestal functions as an anchor to aid in bonding the molding compound to the substrate, and also as a standoff to maintain a preselected clearance between the substrate and the printed circuit board.

In a further embodiment of the invention, a portion of the molding compound extends beyond the surface of the substrate to form an alignment pin. The pin functions as an anchor to aid in bonding the molding compound to the substrate, and also as an alignment aid to maintain positional relationships between the substrate and the printed circuit board.

In yet another embodiment of the invention, the overmolded semiconductor is part of a printed circuit board containing other active circuitry.

DETAILED DESCRIPTION OF THE PREFERRED EMBODIMENT

Figure 1:
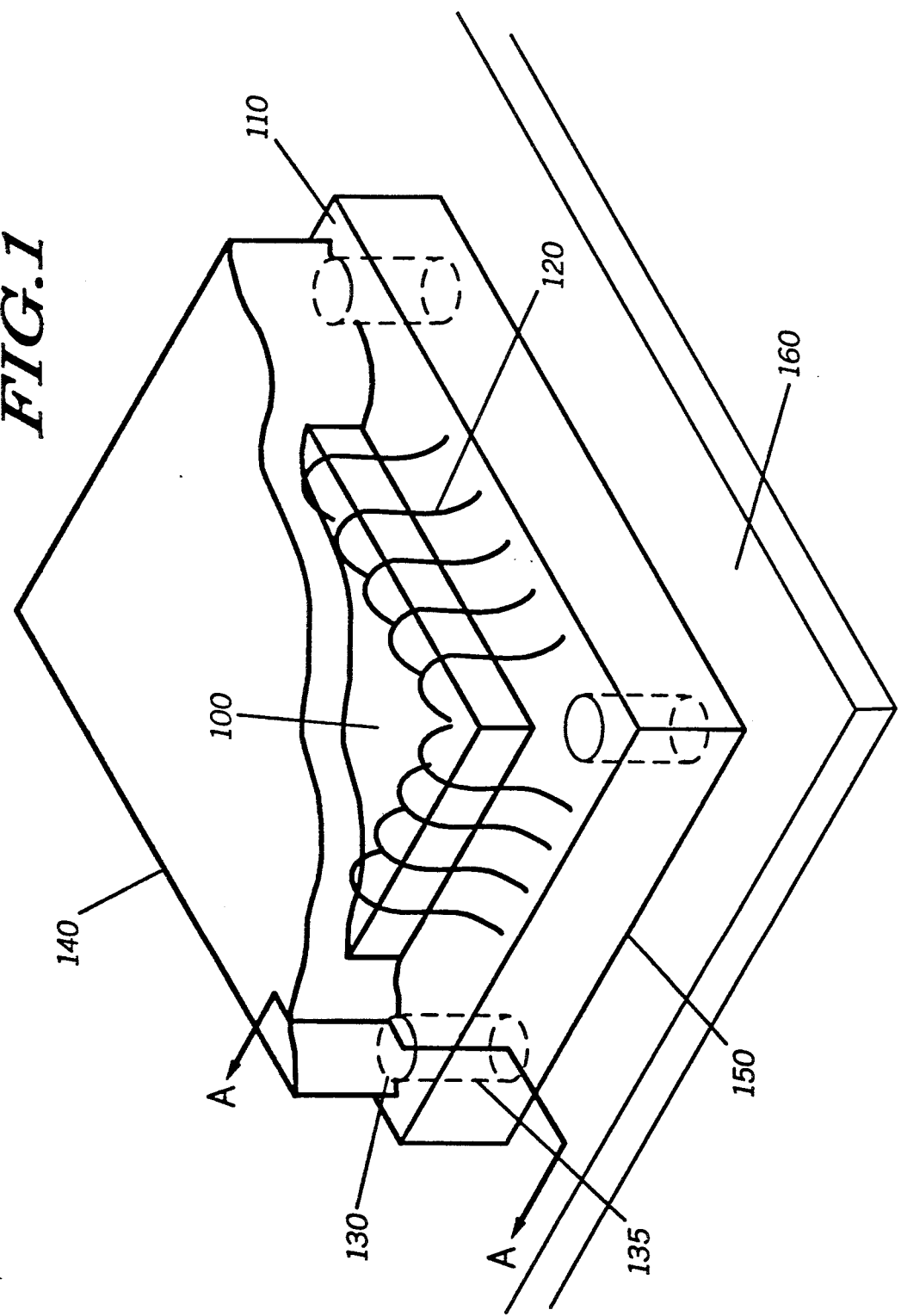
FIG. 1 is an isometric view of an overmolded chip carrier in accordance with the present invention.

Referring to FIG. 1, a semiconductor device 100 is mechanically and/or electrically attached to a substrate 110 by means of a conductive bond at the interface of the device and the substrate, generally by means of conductive epoxy. Electrical connection of the various semiconductor device functions to the substrate is made by wire bonds 120, although the device may also be connected to the substrate by TAB bonding, flip chip bonding, or other methods well known in the art. The substrate 110 contains the necessary conductors and connections (not shown) to route the output of the semiconductor device 100 to the remainder of the electrical assembly. In the case of the chip carrier 150 shown in FIGS. 1-5, the electrical connections are ultimately made through a soldered connection to the printed circuit board 160, but the semiconductor device may also be mounted directly on the printed circuit board 160 and overmolded, eliminating the substrate 110.

The substrate 110 contains one or more holes 130 extending completely through the substrate. The holes 130 may be electrically conductive, as in the case of plated through holes, but will accomplish the same purpose without being conductive. An overmold compound 140 is applied about the semiconductor device 100 in order to encapsulate it. The application and use of overmold compound is well known to those skilled in the art. During the molding process, the molding compound also flows into the holes 130 in the substrate 110, providing a mechanical bond in the form of a pin or 'rivet' to aid in adhesion of the molding compound 140 to the substrate 110. This 'rivet' or anchor resists the bending or thermal stresses imparted to the package, and prevents delamination of the molding compound-substrate interface.

The examples shown in FIGS. 1-5, while illustrative, are not meant to be considered limiting, and other shapes of the mechanical strengthening means or 'rivet', pedestal or spacer, alignment pin, and combinations thereof are considered well within the spirit of the invention. Suitable substrate materials may be a rigid substrate or a flexible film, such as may normally be used in the industry. For example, substrate materials such as ceramic, glass reinforced epoxy, glass reinforced polyimide, glass reinforced polyester, glass reinforced polytetrafluoroethylene, polyimide, polyester, polyetherimide, polyethersulfone, polyetheretherketone, and other high temperature engineering thermoplastics, alone or in conjunction with glass or other mineral reinforcing materials, may be used. The cross sectional shape of the 'rivet', pedestal, and alignment pin, while shown for purposes of illustration as circular, may be other desired configurations such as triangular, rectangular, or polygonal.

Figure 2:
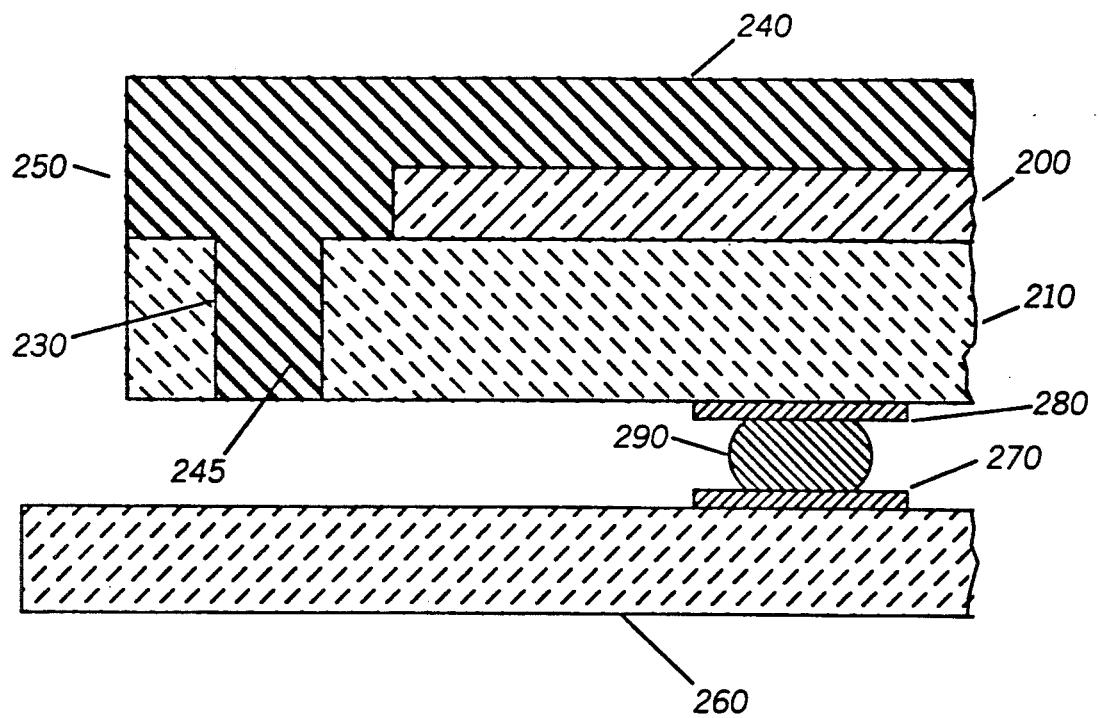
FIG. 2 is a cross-sectional view of the chip carrier of FIG. 1 through section AA.
Figure 3:
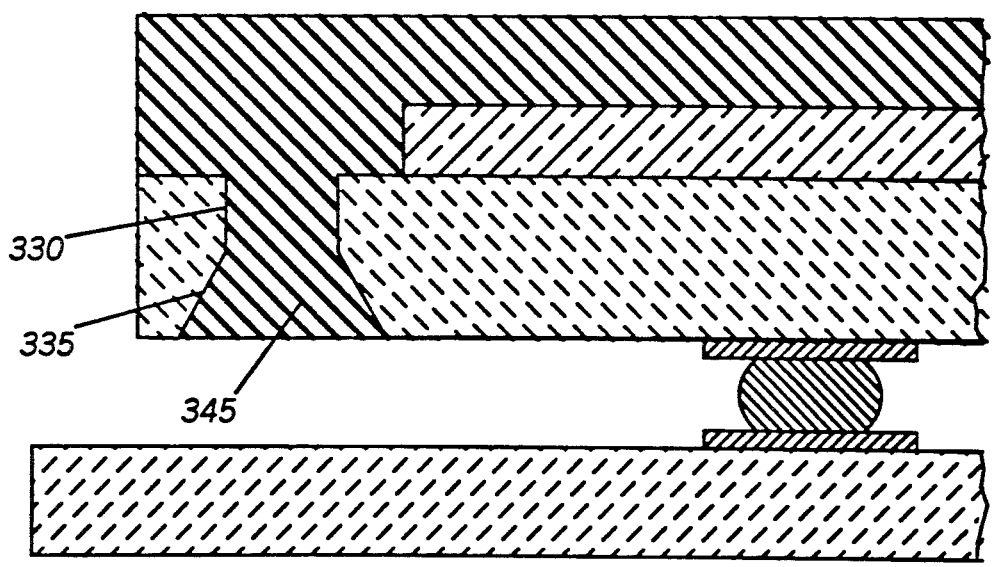
FIG. 3 is a cross-sectional view of another embodiment of a chip carrier in accordance with the present invention.
Figure 4:
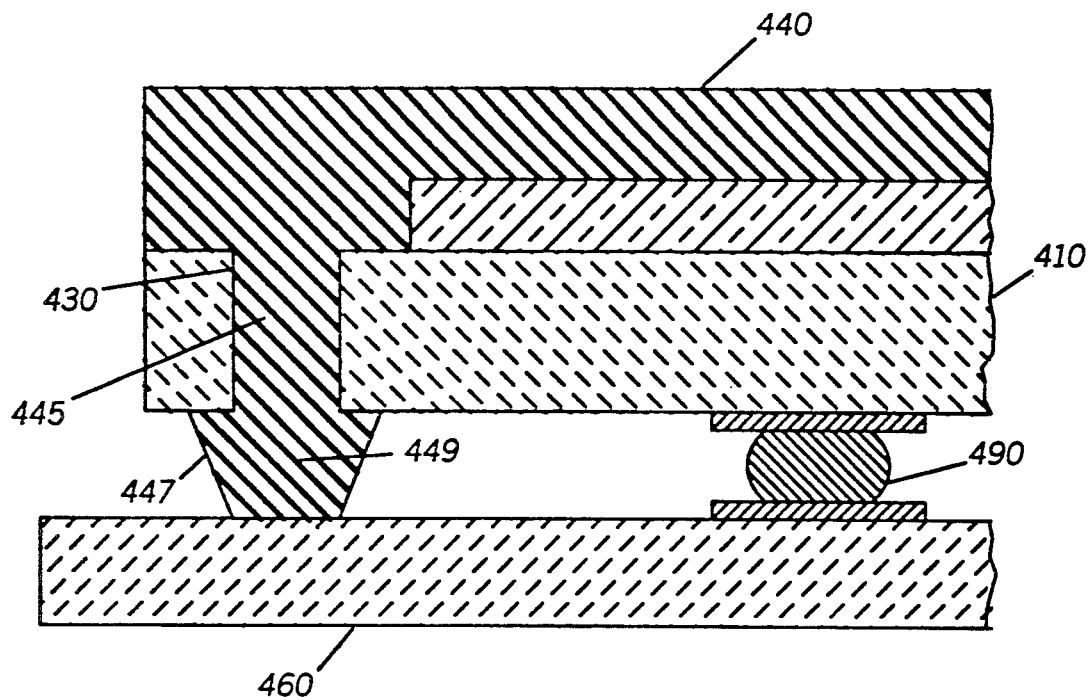
FIG. 4 is a cross-sectional view of another embodiment of the chip carrier in accordance with the present invention.
Figure 5:
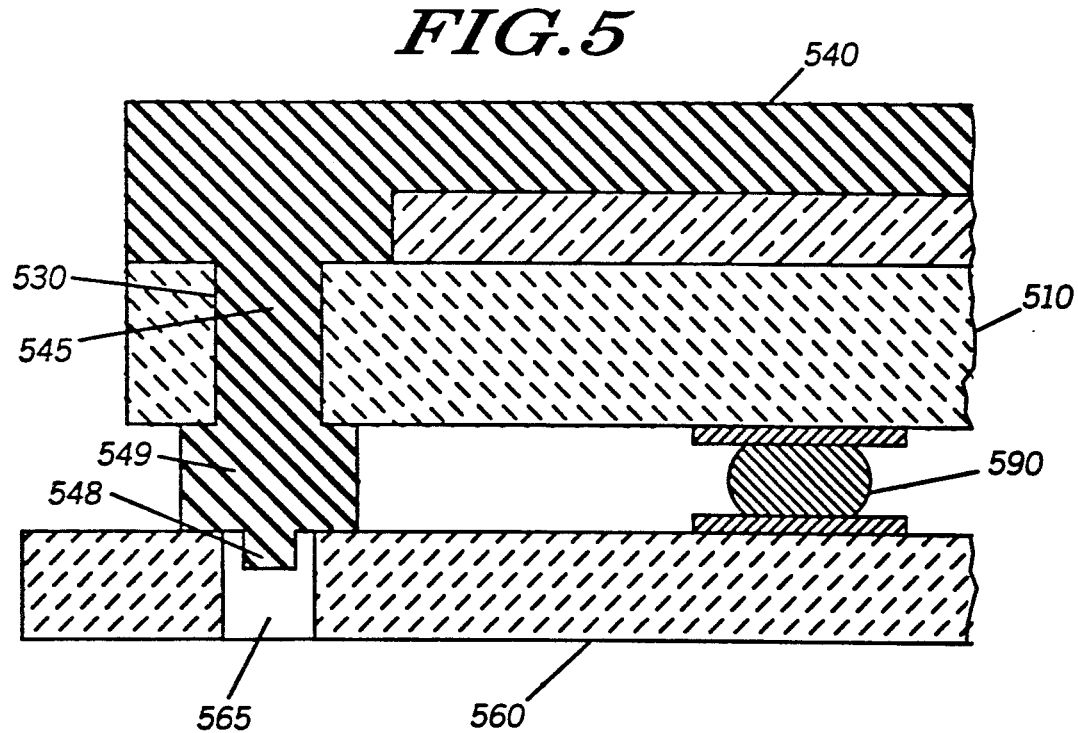
FIG. 5 is a cross-sectional view of another embodiment of the chip carrier in accordance with the present invention.

Referring to FIG. 2, an alternate embodiment extends the overmold compound 240 into the hole 230 in the substrate 210, to form a 'rivet' 245 that aids in anchoring the compound to the substrate. The completed chip carrier 250 is attached to the printed circuit board 260 by means of one or more solder joints 290 connecting the conductors 270 on the printed circuit board and the conductors 280 on the substrate.

In another embodiment of the invention (FIG. 3), the hole 330 contains tapered walls 335 that extend at least partially into the barrel of the hole. The 'rivet' 345 thus formed provides increased mechanical strength compared to that shown in FIG. 2. Both configurations provide an essentially flush surface on the solder side of the chip carrier, that enables use of this configuration with leadless chip carriers used in conventional soldering processes or in the controlled collapse soldering process.

In yet another embodiment (FIG. 4), the walls of the hole 430 are straight and the 'rivet' 445 extends beyond the solder surface of the substrate 410 to form a pedestal 449. The diameter of pedestal 449 may be the same as or less than that of hole 430, or it may be larger to provide additional mechanical strength to the package. Enlarging the diameter of the pedestal results in the molding compound 440 being securely fastened to the substrate. The walls 447 of the pedestal 449 may be straight or tapered, as desired by the needs of the package. The length of the pedestal 449 is determined by the desired clearance between the substrate 410 and the printed circuit board 460. During the soldering operation, the collapse of the solder joint is restricted by the height of the pedestal 449. The pedestal 449 thus provides two functions, that of a 'rivet' to increase adhesion to the overmold compound, and a spacer to provide a selected minimum clearance between the substrate and the printed circuit board.

In a further embodiment (FIG. 5), the walls of the hole 530 are straight and the 'rivet' 545 extends beyond the solder surface of the substrate 510 to form a pedestal 549. The walls 547 of the pedestal 549 may be straight or tapered, as desired by the needs of the package. The length of the pedestal 549 is determined by the desired clearance between the substrate 510 and the printed circuit board 560. During the soldering operation, the collapse of the solder joint is restricted by the height of the pedestal 549. The pedestal 549 also contains a pin or protrusion 548, smaller in diameter than the pedestal, and extending into a hole 565 in the printed circuit board 560. The protrusion 548 functions as an alignment aid for the chip carrier 550 during the assembly operation. In this embodiment, the pedestal 549 thus provides three functions, that of a 'rivet' to increase adhesion of the overmold compound, a spacer to provide a selected minimum clearance between the substrate and the printed circuit board, and an alignment pin to aid in positioning the chip carrier on the printed circuit board. The alignment pin 548 also prevents movement of the chip carrier during the soldering operation, thus maintaining alignment between the conductors on the chip carrier and those in the printed circuit board.

What is claimed is:

1. A transfer molded semiconductor package, comprising:
    a printed circuit substrate having upper and lower opposed surfaces and at least one hole, said hole containing first and second apertures, the first aperture in the upper surface being substantially smaller than the second aperture in the lower surface, and said lower surface having a plurality of solderable surfaces;
    a semiconductor device electrically and mechanically attached to the upper surface of the substrate; and
    molding compound formed around the semiconductor device so as to encapsulate the semiconductor device, said molding compound covering at least a portion of the upper surface of the printed circuit substrate and extending at least partially into the substrate hole.

2. A pad grid array chip carrier, comprising:
    a printed circuit board having upper and lower opposed surfaces and at least one hole, said lower surface having an array of solder pads;
    an integrated circuit device electrically and mechanically attached to the upper surface of the printed circuit board; and
    a transfer molded cover totally encapsulating the integrated circuit device and substantially all of the upper surface of the printed circuit board and extending through at least one of said printed circuit board holes to form at least one pedestal on the lower surface of the printed circuit board.

3. The package of claim 1, wherein the molding compound includes a portion extending through the hole, beyond the lower surface of the substrate.

4. The package of claim 3, wherein the molding compound portion forms a pedestal on the lower surface of the substrate.

5. The package of claim 3, wherein the molding compound portion forms a locating means on the lower surface of the substrate.

6. The package of claim 5 wherein the locating means comprises an alignment pin.

7. The package of claim 3, wherein the package comprises a chip carrier.

8. A transfer-molded chip carrier, comprising:
a printed circuit substrate having upper and lower opposed surfaces and at least one through hole, said lower surface having an array of solderable pads;
an integrated circuit device electrically and mechanically attached to the upper surface of the substrate; and
plastic molding compound formed about the integrated circuit device so as to totally encapsulate the device, the molding compound covering substantially all of the upper surface of the substrate and extending at least partially into said at least one hole.

9. The chip carrier of claim 8, wherein the hole contains first and second apertures, the first aperture in the upper surface being substantially smaller than the second aperture.

10. The chip carrier of claim 8, wherein the plastic molding compound includes a portion extending through the hole, beyond the lower surface of the substrate.

11. The chip carrier of claim 10, wherein the molding compound portion forms a pedestal on the lower surface of the substrate.

12. The chip carrier of claim 10, wherein the molding compound portion forms a locating means on the lower surface of the substrate.

13. The chip carrier of claim 12 wherein the locating means comprises an alignment pin.

14. The chip carrier of claim 8, wherein the substrate comprises a rigid member.

15. The chip carrier of claim 8, wherein the substrate comprises a flexible film.

* * * * *